United States Patent
Lin et al.

(10) Patent No.: US 9,740,094 B2
(45) Date of Patent: *Aug. 22, 2017

(54) DAMAGE PREVENTION ON EUV MASK

(71) Applicant: Taiwan Semiconductor Manufacturing Company, Ltd., Hsin-Chu (TW)

(72) Inventors: Kuan-Wen Lin, Taichung (TW); Chi-Lun Lu, Hsinchu (TW); Ching-Wei Shen, Hsinchu (TW); Shu-Hsien Wu, Hsin-Chu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/832,099

(22) Filed: Aug. 21, 2015

(65) Prior Publication Data
US 2017/0052443 A1    Feb. 23, 2017

(51) Int. Cl.
*G03F 1/82* (2012.01)
*B08B 3/02* (2006.01)
*B08B 3/08* (2006.01)
*B08B 3/10* (2006.01)
*G03F 7/20* (2006.01)

(52) U.S. Cl.
CPC ............ *G03F 1/82* (2013.01); *B08B 3/02* (2013.01); *B08B 3/08* (2013.01); *B08B 3/10* (2013.01); *G03F 7/2004* (2013.01)

(58) Field of Classification Search
CPC ........................................................ G03F 1/82
See application file for complete search history.

(56) References Cited

U.S. PATENT DOCUMENTS

| | | | |
|---|---|---|---|
| 8,628,897 | B1 | 1/2014 | Lu et al. |
| 8,679,707 | B2 | 3/2014 | Lee et al. |
| 8,691,476 | B2 | 4/2014 | Yu et al. |
| 8,709,682 | B2 | 4/2014 | Chen et al. |
| 8,715,890 | B2 | 5/2014 | Tu et al. |
| 8,722,286 | B2 | 5/2014 | Yu et al. |
| 8,753,788 | B1 | 6/2014 | Yu et al. |
| 8,764,995 | B2 | 7/2014 | Chang et al. |
| 8,765,330 | B2 | 7/2014 | Shih et al. |
| 8,765,582 | B2 | 7/2014 | Hsu et al. |
| 8,785,084 | B2 | 7/2014 | Lu et al. |
| 8,828,625 | B2 | 9/2014 | Lu et al. |

(Continued)

FOREIGN PATENT DOCUMENTS

| | | |
|---|---|---|
| EP | 2824511 | 1/2015 |
| JP | 2009544148 | 12/2009 |

(Continued)

*Primary Examiner* — Kathleen Duda
(74) *Attorney, Agent, or Firm* — Haynes and Boone, LLP

(57) ABSTRACT

A method of cleaning a photomask is disclosed. The method includes mixing a first chemical solution with a second chemical solution; and discharging the mixed chemical solution through an outlet of a nozzle to a surface of the photomask on which includes a ruthenium (Ru) layer, wherein the first chemical solution is configured to dislodge contaminant particles from the surface of the photomask and the second chemical solution is configured to provide an electron to the first chemical solution.

20 Claims, 5 Drawing Sheets

(56) References Cited

U.S. PATENT DOCUMENTS

| | | | |
|---|---|---|---|
| 8,841,047 B2 | 9/2014 | Yu et al. | |
| 8,877,409 B2 | 11/2014 | Hsu et al. | |
| 2008/0185021 A1* | 8/2008 | Chiu | G03F 1/82 134/28 |
| 2016/0059272 A1* | 3/2016 | Cheng | H01L 21/02041 134/4 |

FOREIGN PATENT DOCUMENTS

| | | |
|---|---|---|
| TW | 201435143 | 9/2014 |
| TW | 201504430 | 2/2015 |
| TW | 201509821 | 3/2015 |

\* cited by examiner

DAMAGE PREVENTION ON EUV MASK

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing. For these advances to be realized, similar developments in IC processing and manufacturing are needed. For example, the need to perform higher resolution lithography processes grows. One lithography technique is extreme ultraviolet lithography (EUVL). The EUVL employs a photomask to be exposed in the extreme ultraviolet (EUV) region so as to form a pattern on a substrate. Generally, a photomask employed in the EUVL is referred to as a "EUV photomask." Light in the EUV region has a wavelength of about 1-100 nm.

While existing lithography techniques have been generally adequate for their intended purposes, they have not been entirely satisfactory in every aspect. For example, reuse of the EUV photomask has given rise to an issue in the EUVL process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
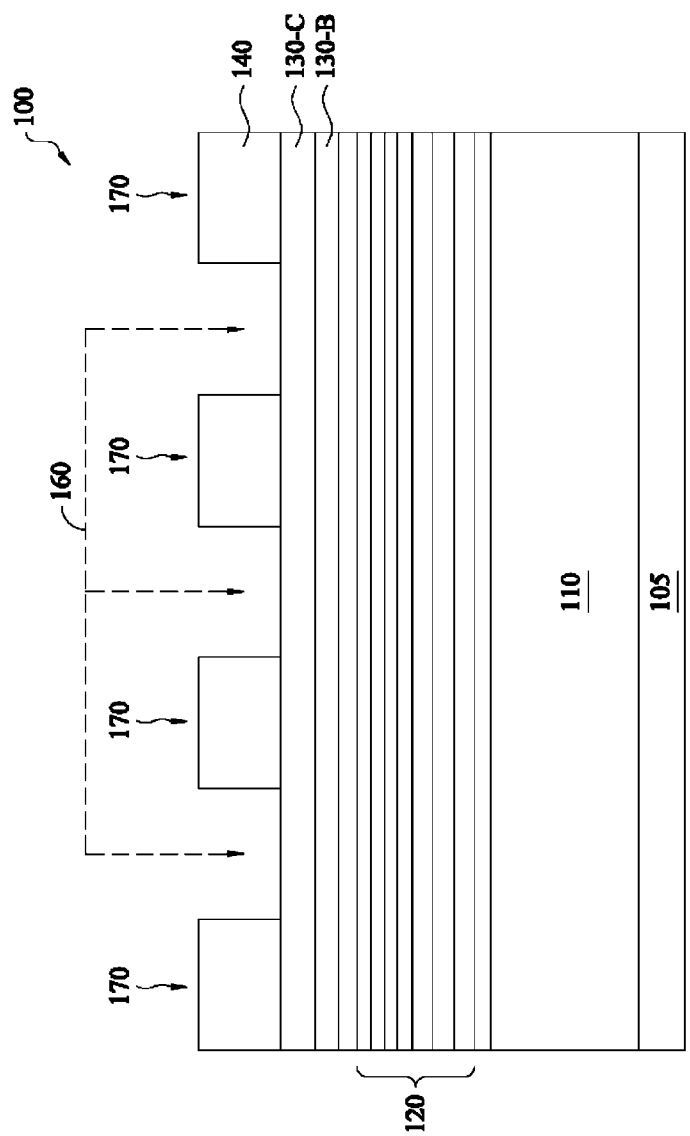
FIG. 1 illustrates an example of an extreme ultra violet (EUV) photomask in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Extreme ultraviolet lithography (EUVL) is a promising patterning technology for very small semiconductor technology nodes, such as 14-nm, and beyond. EUVL is very similar to optical lithography in that it needs a photomask to print wafers, except that it employs light in the EUV region that ranges from about 1 nm to about 100 nm. Most commonly, light used in the EUVL process is about 13.5 nm. At the wavelength of 13.5 nm, most materials are highly absorbing. Thus, reflective optics, rather than refractive optics, are commonly used in EUVL.

FIG. 1 shows an embodiment of an EUV photomask 100 used in EUVL in accordance with various embodiments. In general, a variety of photomasks may be used in the EUVL, and the disclosed method to clean such photomasks still falls within the scope of the present disclosure. For example, the EUV photomasks may include binary intensity photomasks (BIM) and phase-shifting photomasks (PSM). An example of BIM includes an almost totally absorptive region (also referred to as a dark region) and a reflective region. In the opaque region, an absorber is present and incident light is almost fully absorbed by the absorber. In the reflective region, the absorber is removed and incident light is reflected by a multilayer (ML). A PSM includes an absorptive region and a reflective region. The phase difference (generally 180°) between a portion of a light reflected from the absorptive region and a portion of the light reflected from the reflective region enhances resolution and image quality. The PSM can be an attenuated PSM (AttPSM) or an alternating PSM (AltPSM). An AttPSM usually has a reflectivity of 2%-15% from its absorber, while an AltPSM usually has a reflectivity of larger than 50% from its absorber.

Referring still to FIG. 1, the photomask 100 includes a mask substrate 110 made of low thermal expansion material (LTEM). The LTEM material may include $TiO_2$ doped $SiO_2$, and/or other low thermal expansion materials. The LTEM substrate 110 serves to minimize image distortion due to mask heating. In an embodiment, the LTEM substrate includes materials with a low defect level and a smooth surface. In addition, a conductive layer 105 may be formed on the backside surface of the LTEM substrate 110 (as shown in FIG. 1) for the electrostatic chucking purpose. In an embodiment, the conductive layer 105 includes chromium nitride (CrN), or other suitable conductive material.

The photomask 100 includes a reflective multilayer (ML) 120 disposed over the mask substrate 110 on the front surface (i.e. opposite the surface on which the conductive layer 105 is formed). In accordance with the Fresnel equations, light reflection occurs when light propagates across an interface between two materials of different refractive indices. The greater the difference between the refractive indices of layers, the higher the intensity of the reflected light becomes as it propagates across the layers. To increase the intensity of the reflected light, in some embodiments, a multilayer of alternating materials may be used to increase the number of interfaces so as to cause the light reflected from each of the different interfaces to interfere constructively. The ML 120 includes a plurality of film pairs, such as molybdenum-silicon (Mo/Si) film pairs (e.g., a layer of molybdenum above or below a layer of silicon in each film pair). Alternatively, the ML 120 may include molybdenum-beryllium (Mo/Be) film pairs, or any suitable material that is highly reflective at EUV wavelengths. The thickness of each layer of the ML 120 depends on the EUV wavelength and the incident angle. The thickness of the ML 120 is adjusted to achieve a maximum constructive interference of the EUV light reflected at each interface and a minimum absorption of the EUV light by the ML 120. The ML 120 may be selected such that it provides a high reflectivity to a selected radiation type and/or wavelength. In a specific example, the number of the film pairs in the ML 120 may range from 20 to 80, however any number of film pairs may be used. In one example, the ML 120 includes forty pairs of layers of Mo/Si. In such an example, each Mo/Si film pair has a thickness of about 7 nm and ML 120 has a total thickness of 280 nm. In this case, a reflectivity of about 70% is achieved.

The photomask 100 includes a protection layer 130 formed over the ML 120 for one or more functions. In one example, the protection layer 130 functions as an etch stop layer in a patterning process or other operations, such as repairing or cleaning. In another example, the protection layer functions to prevent oxidation of the ML 120. The protection layer 130 may include a single film or multiple films to achieve the intended functions. In some embodiments, the protection layer includes a buffer layer 130-B disposed over the ML 120 and a capping layer 130-C disposed over the buffer layer. The buffer layer 130-B is designed to prevent oxidation of the ML 120. In some examples, the buffer layer 130-B may include silicon with about 4-7 nm thickness. In other examples, a low temperature deposition process may be chosen to form the buffer layer 130-B to prevent inter-diffusion of the ML 120. With regard to the capping layer 130-C formed over the buffer layer 130-B, such capping layer 130-C may be formed over the buffer layer 130-B to act as an etching stop layer in a patterning or repairing/cleaning process of an absorption layer. The capping layer 130-C has different etching characteristics from the absorption layer. In accordance with various illustrative embodiments, the capping layer 130-C includes ruthenium (Ru), Ru compounds such as RuB, RuSi, chromium (Cr), Cr oxide, and Cr nitride. A low temperature deposition process is often chosen for the capping layer 130-C to prevent inter-diffusion of the ML 120.

The photomask 100 also includes an absorption layer 140 is formed over the protection layer 130. In an embodiment, the absorption layer 140 absorbs radiation in the EUV wavelength range projected onto a patterned mask. The absorption layer 140 includes multiple film layers with each film containing chromium, chromium oxide, chromium nitride, titanium, titanium oxide, titanium nitride, tantalum, tantalum oxide, tantalum nitride, tantalum oxynitride, tantalum boron nitride, tantalum boron oxide, tantalum boron oxynitride, aluminum, aluminum-copper, aluminum oxide, silver, silver oxide, palladium, ruthenium, molybdenum, other suitable materials, or mixture of some of the above.

Still referring to FIG. 1, in some embodiments, the absorption layer 140 may be patterned according to an IC layout pattern (or simply IC pattern). For example, as shown in FIG. 1, the absorption layer 140 is patterned to define opaque regions 170 and reflective regions 160. In the opaque region 170, the absorption layer 140 remains on the photomask 100 while in the reflective region 160, the absorption layer 140 is removed.

As described above, the capping layer 130-C (i.e., Ru layer) of the protection layer 130 may serve as an etching stop layer in a repairing/cleaning process of the photomask 100. Conventionally, a variety of mask cleaning agents are used to remove any contaminant particles on the surface of the photomask 100, especially the reflective region 160 and the opaque region 170. In an example, the mask cleaning agents include water, carbonic acid, hydrogen peroxide, and/or a combination hereof. Although such mask cleaning agent works properly to remove contaminant particles, the mask cleaning agent may react with the capping layer, Ru layer, to oxidize the Ru layer. Such oxidation process of the Ru layer forms a $Ru_xO_y$ layer (e.g., RuO, $RuO_2$, $RuO_3$, $RuO_4$, etc.) over the surface of the photomask 100, including the opaque region 170 and the reflective region 160. The formed $Ru_xO_y$ layer may disadvantageously affect a desired function of the photomask 100 such as for example, causing damage to a pattern on the photomask, causing a defect to be formed during the EUVL process, etc. Thus, the present application provides methods and systems to prevent such formation of the $Ru_xO_y$ layer during the cleaning process while allowing the use of the mask cleaning agent to efficiently remove any contaminant particles on the surface of the photomask 100.

Figure 2:
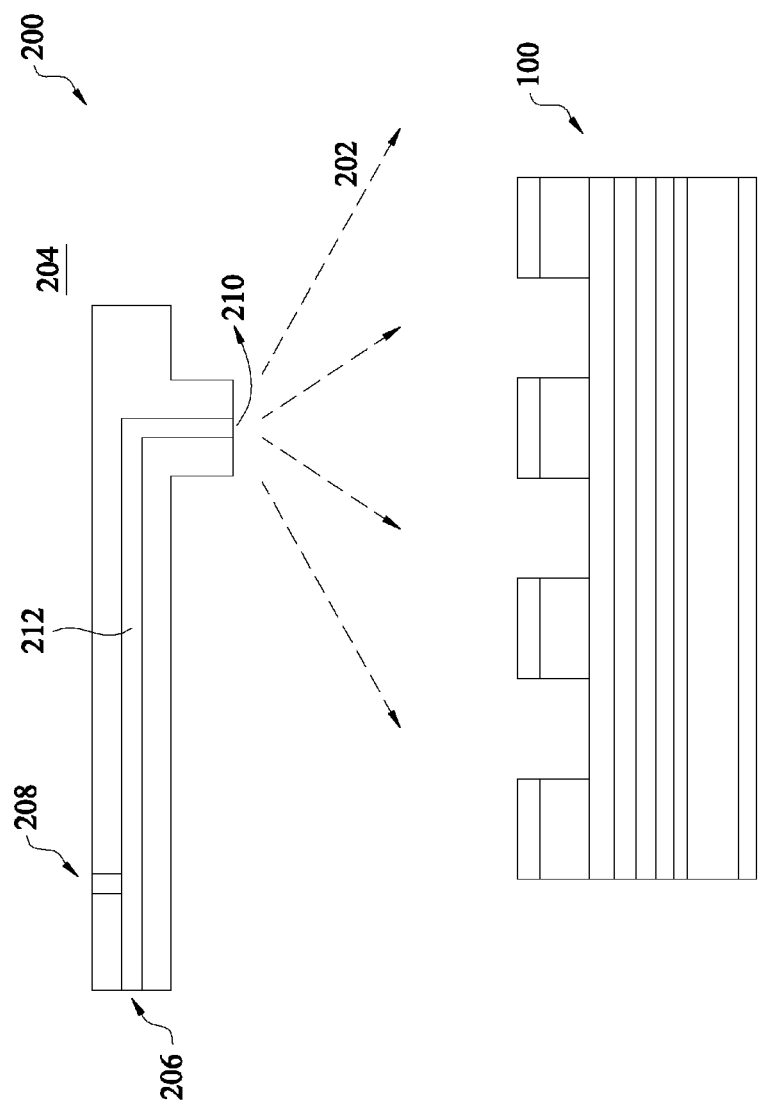
FIG. 2 illustrates a system of cleaning the EUV photomask of FIG. 1 in accordance with some embodiments of the present disclosure.

FIG. 2 shows an embodiment of a system 200 to clean the photomask 100. As shown, the system 200 includes a nozzle 204. In an embodiment, the photomask 100 is placed beneath the nozzle 204. The photomask 100 may be secured by a stage, a chuck, or any suitable equipment (not shown). Alternatively or additionally, the photomask 100 may be placed in any location adjacent the nozzle 204. The nozzle 204 includes inlets 206, 208, and an outlet 210. In some embodiments, the nozzle 204 may include any number of inlets and/or outlets for any suitable purpose Referring now to FIG. 3, a flow chart is shown to illustrate a method 300 of cleaning a photomask in accordance with various embodiments. The method 300 is described in conjunction with the system 200 of FIG. 2 and the photomask 100 of FIG. 1. Although in the illustrative embodiment of FIG. 3, the method 300 is directed to cleaning a EUV photomask, the presently disclosed method 300 may be applied to clean a variety of types of photomasks and/or wafers.

The method 300 starts in block 302 with supplying the mask cleaning agent (or first chemical solution) to the inlet 206. As described above, the mask cleaning agent may include water, carbonic acid, hydrogen peroxide, and/or a combination hereof. The method 300 continues in block 304 with supplying the inlet 208 with an anti-oxidation agent (or second chemical solution). In a specific embodiment, such anti-oxidation agent is configured to provide an electron to the mask cleaning agent so that while the mask cleaning agent is being used to remove contaminant particles of the photomask 100, an oxidation reaction between the Ru layer and the mask cleaning agent may be advantageously prevented. In some embodiments, the anti-oxidation agent may include one or more of: haloid, sulfite, sulfate, sodium borohydride, lithium borohydride, lithium aluminum hydride, and/or ascorbic acid. Details of the chemical reactions involved among the Ru layer, the mask cleaning agent, and the anti-oxidation agent are described below with respect to FIG. 4.

Figure 3:
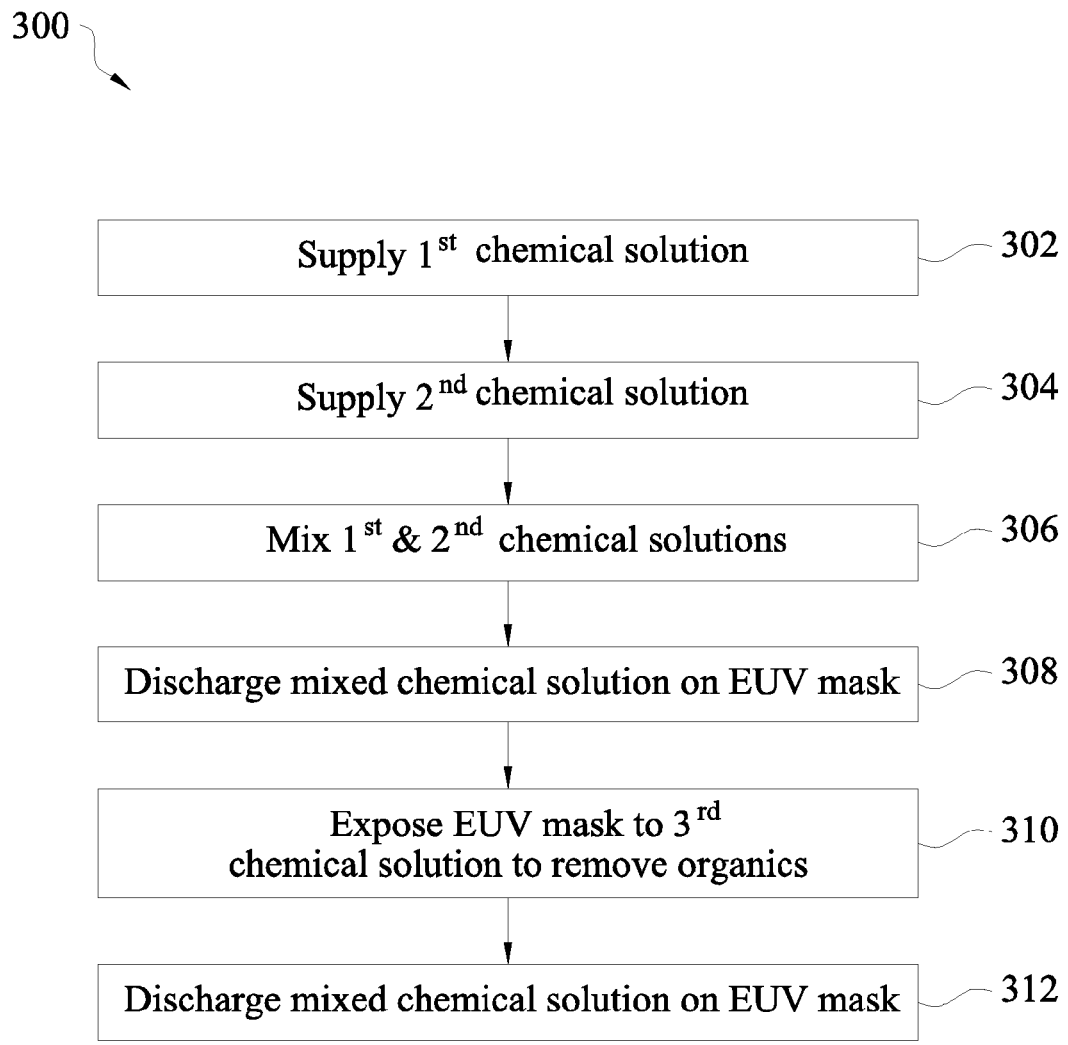
FIG. 3 illustrates a method of using the system of FIG. 2 to clean a photomask in accordance with some embodiments of the present disclosure.

In FIG. 3, after the inlets 206 and 208 are respectively supplied with the mask cleaning agent and the anti-oxidation agent, in block 306, the mask cleaning agent and the anti-oxidation agent may be mixed in pipe 212 of the nozzle 204. In block 308, such mixed solution (i.e., the mask cleaning agent and the anti-oxidation agent) may be dispensed (i.e., 202) onto the photomask 100 via the outlet 210 of the nozzle 204. As such, the pipe 212 may be designed to include two inlets 206 and 208, and the outlet 210. Although in the illustrative embodiment of FIG. 2 the nozzle 204 includes a pipe that is configured to mix the mask cleaning agent and the anti-oxidation agent prior to the dispensing of mixed mask cleaning agent and anti-oxidation agent solution, in an alternative embodiment, the mask cleaning agent and the anti-oxidation agent may be dispensed onto the photomask 100 sequentially. For example, firstly, the mask cleaning agent may be supplied through the inlet 206, delivered though pipe 212, and dispensed via the outlet 210 onto the photomask 100. After all or part of the supplied mask cleaning agent is delivered through the pipe 212, the anti-oxidation agent may be subsequently supplied through the inlet 208, delivered through the pipe 212, and dispensed via the outlet 210 onto the photomask 100. Still in an alternative embodiment, nozzle 204 is configured to simultaneously dispense mask cleaning agent and the anti-oxidation agent onto the photomask 100 through separate delivery pathways (i.e. separate dispensing pipes/tube within nozzle 204). In such an embodiment, mask cleaning agent is dispensed onto the photomask 100 directly via the inlet 206 and through the outlet 210 using a first pipe, and at the same time, anti-oxidation agent is dispensed onto the photomask 100 directly via the inlet 208 and through the outlet 210 using a second pipe that is separate from the first pipe.

Referring still to block 308 of method 300, in accordance with some embodiments, the dispensing may be performed at about room temperature and at about one standard atmosphere. Still in other embodiments, the dispensing occurs at a temperature ranging from about room temperature to about 50° C. and at about one atm.

Method 300 may then proceed to the processes disclosed in blocks 312 and 314. For example, at block 310 photomask 100 is exposed to another chemical solution (or third chemical solution) to remove organic contaminants (e.g., photoresist strips) on the photomask 100. In some embodiments, the chemical solution may include sulfide acid, hydrogen peroxide, or a combination (i.e., SPM) thereof. Still in some embodiments, plasma, aqueous ozone ($DIO_3$), and/or acoustic wave (e.g., Megasonic wave) may also be used to remove the organic contaminants (e.g., photoresist strips) on the photomask 100 at block 310. Method 300 may then proceed to block 312 in which the mask cleaning agent and the anti-oxidation agent is dispensed again on the photomask 100 to remove any residual particle contaminants similarly as described at blocks 302-308.

Figure 4A:
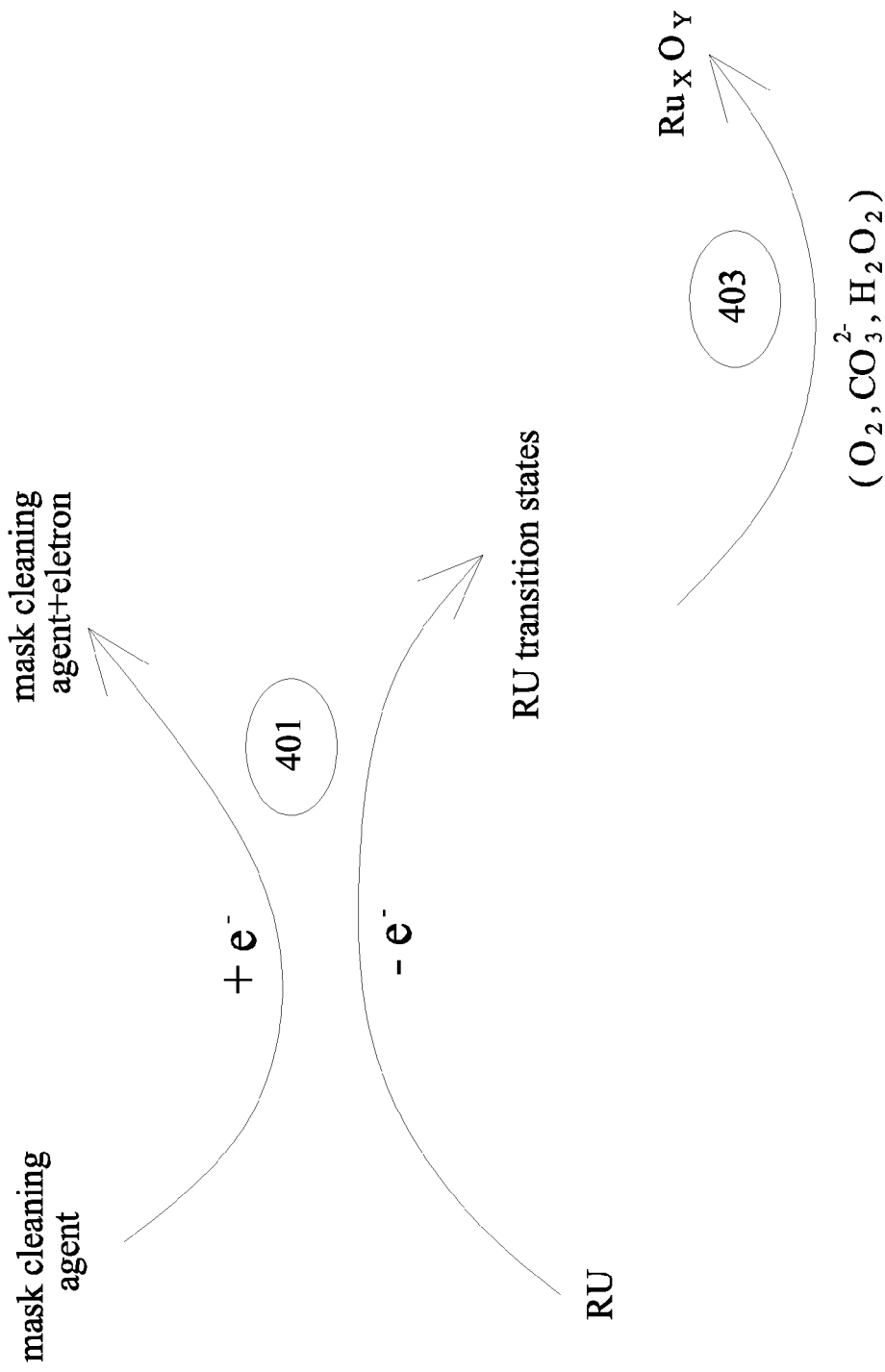
FIG. 4A illustrates an exemplary chemical reaction between a mask cleaning agent and a ruthenium layer of a photomask in accordance with some embodiments of the present disclosure.
Figure 4B:
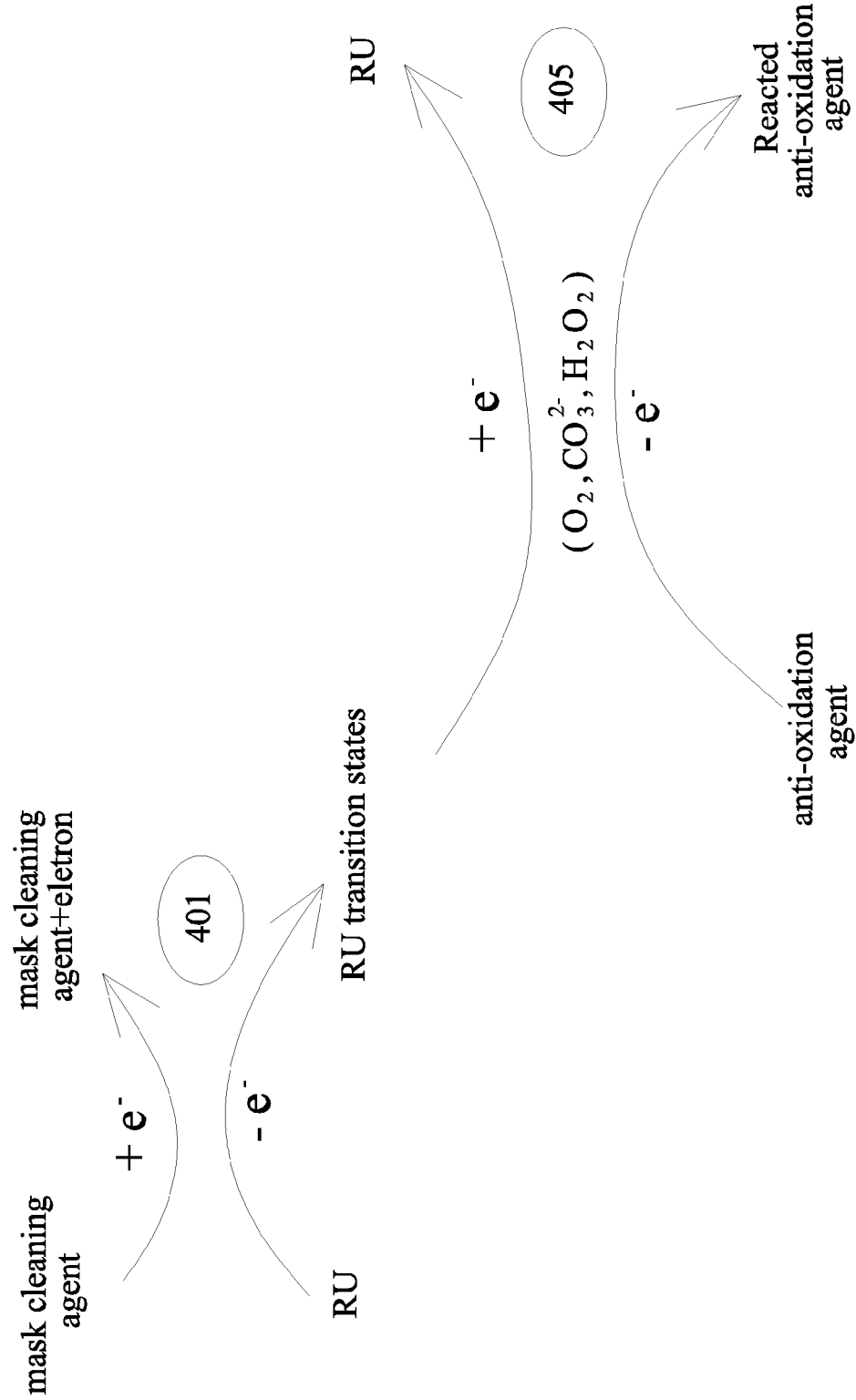
FIG. 4B illustrates an exemplary chemical reaction between an anti-oxidation agent and a ruthenium layer of a photomask in accordance with some embodiments of the present disclosure.

FIG. 4A shows the chemical reaction of cleaning the photomask 100 without using the anti-oxidation agent and FIG. 4B shows the chemical reaction of cleaning the photomask 100 by using the anti-oxidation agent with the mask cleaning agent. As shown in FIG. 4A, the mask cleaning agent is used alone to clean the photomask 100 so as to remove contaminant particles. Under such circumstance, while the mask cleaning agent is dispersed on the surface of the photomask 100, the mask cleaning agent reacts with the Ru layer (i.e., the capping layer 130-C with respect to FIG. 1). Generally, such reaction may be a reduction-oxidation process. That is, the mask cleaning agent receives an electron from a Ru atom of the Ru layer 130-C; the Ru atom that provides the electron to the mask cleaning agent then loses/donates the electron. The process of losing an electron is generally referred to as an oxidation process, and the process of receiving an electron is referred to as a reduction process. Upon the reaction 401, the Ru atom(s) of the Ru layer 130-C that loses electron(s) may transition to a transitional state (e.g., Ru(I), Ru(II), Ru(IV), Ru(VI), Ru(VIII), etc). Such transitional states of Ru react (403) with component/molecule (e.g., $O_2$, $CO_3^{2-}$, $H_2O_2$, $O_3$, etc) of the reacted mask cleaning agent to form oxidized Ru, $Ru_xO_y$. This causes contaminations to form on photomask 100 which affect future (i.e. reuse) lithography process utilizing the mask.

In contrast, as shown in FIG. 4B, by using the anti-oxidation agent disclosed in the present disclosure, the reaction 403 may be advantageously avoided. As shown in reaction 405 of FIG. 4B, the anti-oxidation agent may provide an electron to the component/molecule (e.g., $O_2$, $CO_3^{2-}$, $H_2O_2$, $O_3$, etc) of the reacted mask cleaning agent. In other words, the component/molecule (e.g., $O_2$, $CO_3^{2-}$, $H_2O_2$, $O_3$, etc) of the reacted mask cleaning agent may not react with the transitional state of the Ru atom of the Ru layer 130-C. Accordingly, the transitional state of the Ru atom of the Ru layer 130-C may react with the anti-oxidation agent to restore the transitional state of the Ru atom back to Ru atom. In summary, while the mask-cleaning agent performs the cleaning process of the contaminant particles and forms the transitional states of Ru, the transitional state of Ru still does not react with the component/molecule (e.g., $O_2$, $CO_3^{2-}$, $H_2O_2$, $O_3$, etc) of the reacted mask cleaning agent. As such, damage (i.e., oxidation) on the capping layer 130-C may advantageously avoided while removing contaminant particles.

Based on the above discussions, it can be seen that the present disclosure offers various advantages. It is understood, however, that not all advantages are necessarily discussed herein, and other embodiments may offer different advantages, and that no particular advantage is required for all embodiments.

The present disclosure provides a method to clean a photomask in accordance with some embodiments. The method includes applying a first chemical solution and a second chemical solution to a photomask to remove contaminant particles from the photomask, wherein the photomask includes a ruthenium (Ru) layer and the second chemical solution prevents the first chemical solution from reacting with the Ru layer.

In another embodiment, a method of cleaning a photomask is disclosed. The method includes mixing a first chemical solution with a second chemical solution; and discharging the mixed chemical solution through an outlet of a nozzle to a surface of the photomask on which includes a ruthenium (Ru) layer, wherein the first chemical solution is configured to dislodge contaminant particles from the surface of the photomask and the second chemical solution is configured to provide an electron to the first chemical solution.

Yet in another embodiment, a system for cleaning a photomask is disclosed. The system includes a first inlet that is configured to receive a first chemical solution; a second inlet that is coupled to the first inlet and configured to receive a second chemical solution; and an outlet that is coupled to the first and second inlets and configured to discharge a mixed chemical solution that includes the first and second chemical solutions to a surface of the photomask. More specifically, the surface of the photomask includes a ruthenium (Ru) layer and the second chemical solution is configured to provide an electron to the first chemical solution thereby preventing an oxidized Ru layer being formed on the surface of the photomask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    applying a first chemical solution and a second chemical solution to a photomask to remove contaminant particles from the photomask, wherein the photomask includes a ruthenium (Ru) layer and the second chemical solution prevents the first chemical solution from reacting with the Ru layer; and
    mixing the first chemical solution with the second chemical solution to form a mixed solution, and wherein applying the first chemical solution and the second chemical solution to the photomask includes applying the mixed solution.

2. The method of claim 1, wherein the second chemical solution provides an electron to the first chemical solution to prevent the first chemical solution from reacting with the Ru layer.

3. The method of claim 1, further comprising applying a third chemical solution to the photomask to remove an organic compound from the photomask.

4. The method of claim 1, further comprising performing an extreme ultraviolet lithography process using the photomask.

5. The method of claim 1, wherein the first chemical solution includes at least one of: water, carbonic acid, and hydrogen peroxide.

6. The method of claim 1, wherein the second chemical solution includes at least one of: haloid, sulfite, sulfate, sodium borohydride, lithium borohydride, lithium aluminum hydride, and ascorbic acid.

7. The method of claim 1, wherein the applying the first chemical solution and the second chemical solution to the photomask is performed at a temperature ranging from room temperature to 50° C.

8. A method of cleaning a photomask, comprising:
    mixing a first chemical solution with a second chemical solution; and
    discharging the mixed chemical solution through an outlet of a nozzle to a surface of the photomask on which includes a ruthenium (Ru) layer,
    wherein the first chemical solution is configured to dislodge contaminant particles from the surface of the photomask and the second chemical solution is configured to provide an electron to the first chemical solution.

9. The method of claim 8, wherein the photomask is an extreme ultraviolet lithography (EUVL) mask.

10. The method of claim 8 further comprising prior to mixing the first chemical solution with the second chemical solution, supplying the first chemical solution and the second chemical solution respectively to a first inlet and a second inlet of the nozzle.

11. The method of claim 8, wherein the first chemical solution includes at least one of: water, carbonic acid, and hydrogen peroxide.

12. The method of claim 8, wherein the second chemical solution includes at least one of: haloid, sulfite, sulfate, sodium borohydride, lithium borohydride, lithium aluminum hydride, and ascorbic acid.

13. The method of claim 8 further comprising after discharging the mixed chemical solution through the nozzle to the surface of the photomask, exposing the surface of the photomask to a third chemical solution thereby removing an organic compound from the surface of the photomask.

14. The method of claim 13 further comprising after exposing the surface of the photomask to the third chemical solution, discharging the mixed chemical solution through the nozzle to the surface of the photomask.

15. The method of claim 8, wherein discharging the mixed chemical solution to the surface of the photomask is performed at a temperature ranging from room temperature to 50° C.

16. A method comprising:
    mixing a first chemical solution with a second chemical solution to form a mixed solution; and
    applying the mixed solution to a photomask that includes a ruthenium (Ru) layer, wherein the first chemical solution is configured to dislodge contaminant particles from the photomask and the second chemical solution is configured to provide an electron to the first chemical solution.

17. The method of claim 16, further comprising applying a third chemical solution to the photomask after applying the mixed solution to the photomask, the third chemical solution operable to remove an organic compound from the photomask.

18. The method of claim 16, further comprising applying another portion of the mixed solution to the photomask after applying the third chemical solution to the photomask.

19. The method of claim 16, wherein the first, second and third chemical solutions are different from each other.

20. The method of claim 19, wherein the first chemical solution includes a first material selected from the group consisting of water and carbonic acid, and
    wherein the second chemical solution includes a second material selected from the group consisting of haloid, sulfite, sodium borohydride, lithium borohydride, lithium aluminum hydride, and ascorbic acid, and
    wherein the third chemical solution includes a second material selected from the group consisting of sulfide acid and hydrogen peroxide.

* * * * *